(12) United States Patent
Vinciarelli (10) Patent No.: US 12,170,165 B1
(45) Date of Patent: Dec. 17, 2024

(54) METHOD OF MANUFACTURING A PRINTED CIRCUIT BOARD WITH A SELF-ALIGNED SETBACK

(71) Applicant: Vicor Corporation, Andover, MA (US)

(72) Inventor: Patrizio Vinciarelli, Boston, MA (US)

(73) Assignee: Vicor Corporation, Andover, MA (US)

( * ) Notice: Subject to any disclaimer, the term of this patent is extended or adjusted under 35 U.S.C. 154(b) by 5 days.

(21) Appl. No.: 18/092,810

(22) Filed: Jan. 3, 2023

Related U.S. Application Data (62) Division of application No. 16/588,954, filed on Sep. 30, 2019, now Pat. No. 11,640,873, which is a division of application No. 14/822,561, filed on Aug. 10, 2015, now Pat. No. 10,468,181.

(51) Int. Cl.
  *H01F 41/02* (2006.01)
  *H05K 3/44* (2006.01)
  *H05K 3/46* (2006.01)

(52) U.S. Cl.
  CPC ............ *H01F 41/02* (2013.01); *H05K 3/44* (2013.01); *H05K 3/4697* (2013.01)

(58) Field of Classification Search
  CPC .... H01F 41/02; H01F 41/041; H01F 27/2804; H01F 2027/2809; H05K 3/44; H05K 3/4697; H05K 1/181; H05K 1/165; H05K 1/0298; H05K 2201/08; H02M 3/33523
  See application file for complete search history.

(56) References Cited

U.S. PATENT DOCUMENTS

| | | | |
|---|---|---|---|
| 2,998,583 A | * | 8/1961 | Worcester ............... H01F 30/10 216/33 |
| 3,102,213 A | | 8/1963 | Bedson |
| 3,426,305 A | | 2/1969 | Keble |
| 3,833,872 A | * | 9/1974 | Marcus ................ H01F 41/046 336/200 |
| 3,873,756 A | | 3/1975 | Gall et al. |
| 4,150,278 A | * | 4/1979 | Resener ................ H01F 41/02 336/83 |

(Continued)

FOREIGN PATENT DOCUMENTS

| CN | 115588559 A | * | 1/2023 |
|---|---|---|---|
| DE | 28 00 750 A1 | | 7/1979 |

(Continued)

OTHER PUBLICATIONS

Caillaud, et al., "High power PCB-embedded inductors based on ferrite powder," 5th Micro/Nano-Electronics Packaging & Assembly, Design and Manufacturing Forum (MiNaPAD 2017), 44 pages (2017).

*Primary Examiner* — Jeffrey T Carley
(74) *Attorney, Agent, or Firm* — Foley & Lardner LLP (57) ABSTRACT

Electrical/magnetic components and methods of making such components are provided. One method includes providing a multilayer printed circuit board (PCB) including conductive features arranged on conductive layers of the PCB to form one or more windings around one or more predetermined axes. The method further includes forming a hole in the PCB at each of the one or more predetermined axes to accommodate one or more core legs. For each hole, an inner edge of one of the windings overlaps an edge of the hole in a lateral direction after the hole is formed. The method further includes assembling a magnetically permeable core including the one or more core legs, each core leg extending into one of the holes at the one or more predetermined axes.

12 Claims, 9 Drawing Sheets

(56) References Cited

U.S. PATENT DOCUMENTS

| | | | |
|---|---|---|---|
| 4,471,271 A | 9/1984 | Wendt | |
| 4,689,594 A | 8/1987 | Kawabata et al. | |
| 4,696,100 A | 9/1987 | Yamamoto et al. | |
| 4,879,804 A | 11/1989 | Chiang | |
| 5,146,198 A | 9/1992 | Pollard et al. | |
| 5,214,392 A * | 5/1993 | Kobayashi | H03F 3/38 330/10 |
| 5,239,744 A * | 8/1993 | Fleming | H01F 41/16 29/432 |
| 5,353,001 A | 10/1994 | Meinel et al. | |
| 5,400,006 A | 3/1995 | Cardozo | |
| 5,598,327 A | 1/1997 | Somerville et al. | |
| 5,787,569 A | 8/1998 | Lotfi et al. | |
| 6,138,344 A | 10/2000 | Roessler et al. | |
| 6,792,667 B2 * | 9/2004 | Roy | H01F 27/2804 336/200 |
| 6,808,642 B2 | 10/2004 | Takaya et al. | |
| 6,820,321 B2 * | 11/2004 | Harding | H01F 41/046 336/200 |
| 6,903,938 B2 * | 6/2005 | Waffenschmidt | H05K 1/165 336/200 |
| 6,911,848 B2 | 6/2005 | Vinciarelli | |
| 6,930,893 B2 | 8/2005 | Vinciarelli | |
| 6,984,965 B2 | 1/2006 | Vinciarelli | |
| 7,145,786 B2 | 12/2006 | Vinciarelli | |
| 7,170,384 B2 | 1/2007 | Kim et al. | |
| 7,187,263 B2 * | 3/2007 | Vinciarelli | H01F 27/2804 336/200 |
| 7,280,026 B2 | 10/2007 | Chandrasekaran et al. | |
| 7,295,094 B2 * | 11/2007 | Jitaru | H01F 27/2804 336/200 |
| 7,796,615 B2 | 9/2010 | Ochi et al. | |
| 7,915,991 B2 * | 3/2011 | Waffenschmidt | H01F 27/2804 336/20 |
| 8,203,418 B2 | 6/2012 | Harrison et al. | |
| 8,277,678 B2 | 10/2012 | Cheng et al. | |
| 8,344,842 B1 * | 1/2013 | Luzanov | H01F 41/02 336/192 |
| 2001/0054946 A1 * | 12/2001 | Inoue | H01F 27/2804 336/200 |
| 2002/0191379 A1 * | 12/2002 | Wildrick | H01R 12/7088 361/736 |
| 2005/0174207 A1 | 8/2005 | Young et al. | |
| 2006/0154052 A1 | 7/2006 | Waffenschmidt et al. | |
| 2012/0249105 A1 * | 10/2012 | Nussbaum | H02M 3/1584 323/283 |
| 2012/0287582 A1 * | 11/2012 | Vinciarelli | B29C 45/14639 361/728 |
| 2013/0097857 A1 | 4/2013 | Himori et al. | |
| 2013/0240259 A1 * | 9/2013 | Yoshimura | H05K 3/4608 174/266 |
| 2014/0259643 A1 * | 9/2014 | Marcoci | H01F 41/02 29/607 |
| 2014/0353022 A1 * | 12/2014 | Morita | H05K 1/165 174/260 |
| 2015/0116950 A1 | 4/2015 | Yoo et al. | |
| 2017/0178786 A1 * | 6/2017 | Lambert | H01F 41/0206 |
| 2017/0338027 A1 * | 11/2017 | Clements | H01F 27/306 |

FOREIGN PATENT DOCUMENTS

| | | | |
|---|---|---|---|
| EP | 0 708 459 A1 | 4/1996 | |
| GB | 2252208 A * | 7/1992 | H01F 17/0006 |

* cited by examiner

METHOD OF MANUFACTURING A PRINTED CIRCUIT BOARD WITH A SELF-ALIGNED SETBACK

CROSS-REFERENCE TO RELATED APPLICATIONS

This application is a divisional of U.S. patent application Ser. No. 16/588,954, filed Sep. 30, 2019 which is a divisional of U.S. patent application Ser. No. 14/822,561, filed Aug. 10, 2015 (now U.S. Pat. No. 10,468,181), the entire contents of each of these patent applications are incorporated herein by reference.

TECHNICAL FIELD

This disclosure describes apparatus and methods for constructing efficient planar transformers and inductors of the kind that include a magnetic core.

BACKGROUND

A planar inductive element may include a printed circuit board (PCB) with conductive windings positioned for magnetic coupling with other windings, a magnetic core, or both.

SUMMARY

One exemplary method of making a planar magnetic component includes providing a multilayer printed circuit board (PCB) including conductive features arranged on conductive layers of the PCB to form one or more windings around one or more predetermined axes. The method further includes forming a hole in the PCB at each of the one or more predetermined axes to accommodate one or more core legs. For each hole, an inner edge of one of the windings overlaps an edge of the hole in a lateral direction after the hole is formed. The method further includes assembling a magnetically permeable core including the one or more core legs, each core leg extending into one of the holes at the one or more predetermined axes.

Another exemplary method includes providing a multilayer printed circuit board (PCB) including conductive features arranged on conductive layers of the PCB to form one or more windings around one or more predetermined axes. The method further includes forming a hole in the PCB at each of the one or more predetermined axes to accommodate one or more core legs. For each hole, an inner edge of one of the windings overlaps an edge of the hole in a lateral direction after the hole is formed. The method further includes, for each hole, etching the PCB after forming the hole to create a setback between the inner circumferential edge of a respective one of the conductive features and the hole, the setback being created by etching from within the hole radially outward along the inner circumferential edge to remove a setback portion of the conductive feature.

According to another exemplary embodiment, a circuit is formed according to operations including providing a multilayer printed circuit board (PCB) including conductive features arranged on conductive layers of the PCB to form one or more windings around one or more predetermined axes. The operations further include forming a hole in the PCB at each of the one or more predetermined axes to accommodate one or more core legs. For each hole, an inner edge of one of the windings overlaps an edge of the hole in a lateral direction after the hole is formed. The operations further include assembling a magnetically permeable core comprising the one or more core legs, each core leg extending into one of the holes at the one or more predetermined axes.

DETAILED DESCRIPTION

A power architecture using modular power converter components is described in Vinciarelli, Factorized Power Architecture with Point of Load Sine Amplitude Converters, U.S. Pat. No. 6,984,965, issued Jan. 10, 2006, assigned to VLT, Inc. and incorporated herein by reference (the "FPA" patent). Efficient, high-frequency, high-density, and modular power converters are described in: Vinciarelli, Factorized Power Architecture with Point of Load Sine Amplitude Converters, U.S. Pat. No. 6,930,893, issued Aug. 16, 2005 (hereinafter the "SAC I" patent); and Vinciarelli, Point of Load Sine Amplitude Converters and Methods, U.S. Pat. No. 7,145,786, issued Dec. 5, 2006, (hereinafter the "SAC II" patent); each of which is assigned to VLT, Inc. and incorporated herein by reference (collectively the "SAC patents"). As described in the SAC patents, fixed ratio converters based upon the SAC technology fabricated using planar magnetics, e.g. for the power transformer(s), may achieve very high power densities.

Planar inductive elements including inductors and transformers (referred to herein, without loss of generality, as a "planar transformer") may include a printed circuit board ("PCB") including a plurality of conductive layers with intervening insulating layers arranged in a stack, i.e. a multilayer PCB. The PCB in a planar transformer may include one or more conductive windings (formed in one or more of the conductive layers) located to enable magnetic coupling with other windings (formed in other conductive layers in the PCB stack). One or more apertures may be provided in the PCB to accept a magnetic core that may enhance magnetic flux coupling between the various windings. The benefits of planar transformers relative to alternative means of construction, such as turns of wire arranged around a magnetic core structure, may include improved thermal performance, reduced leakage inductance, lower cost, and improved repeatability of operating characteristics.

An improved planar transformer configuration suitable for use in high-frequency power converters, such as those based on the SAC technology, is described in Vinciarelli, Printed Circuit Transformer, U.S. Pat. No. 7,187,263, issued Mar. 6, 2007, assigned to VLT, Inc., (the "Planar Transformer" patent) incorporated herein by reference. It is sometimes beneficial to construct the individual transformer windings, e.g. a primary winding or a secondary winding, using a plurality of individual conductive turns that may be connected together, e.g. in parallel for lower voltage and higher current or series for higher voltage and lower current. For example, the Planar Transformer patent shows several examples of planar transformers having primary and secondary windings comprising multiple conductive turns (formed in several conductive layers) connected together in parallel and series to form desired number of turns in each the winding. For example, FIG. 6 of the Planar Transformer patent shows 9 individual secondary windings, 54a-54i, (some having a single turn and some having two turns) connected together to form a single center-tapped secondary winding shown schematically in FIG. 7. FIGS. 9-21 of the Planar Transformer patent show another example in which a fourteen (14) conductive layer PCB stack includes four (4) individual turns formed in four (4) respective layers connected in series to form the four (4) turn primary winding schematically shown in FIG. 23; and thirty two (32) individual turns formed in eight (8) respective layers connected in series and parallel to form the four (4) two turn center-tapped secondary windings shown schematically in FIG. 22.

Figure 1:
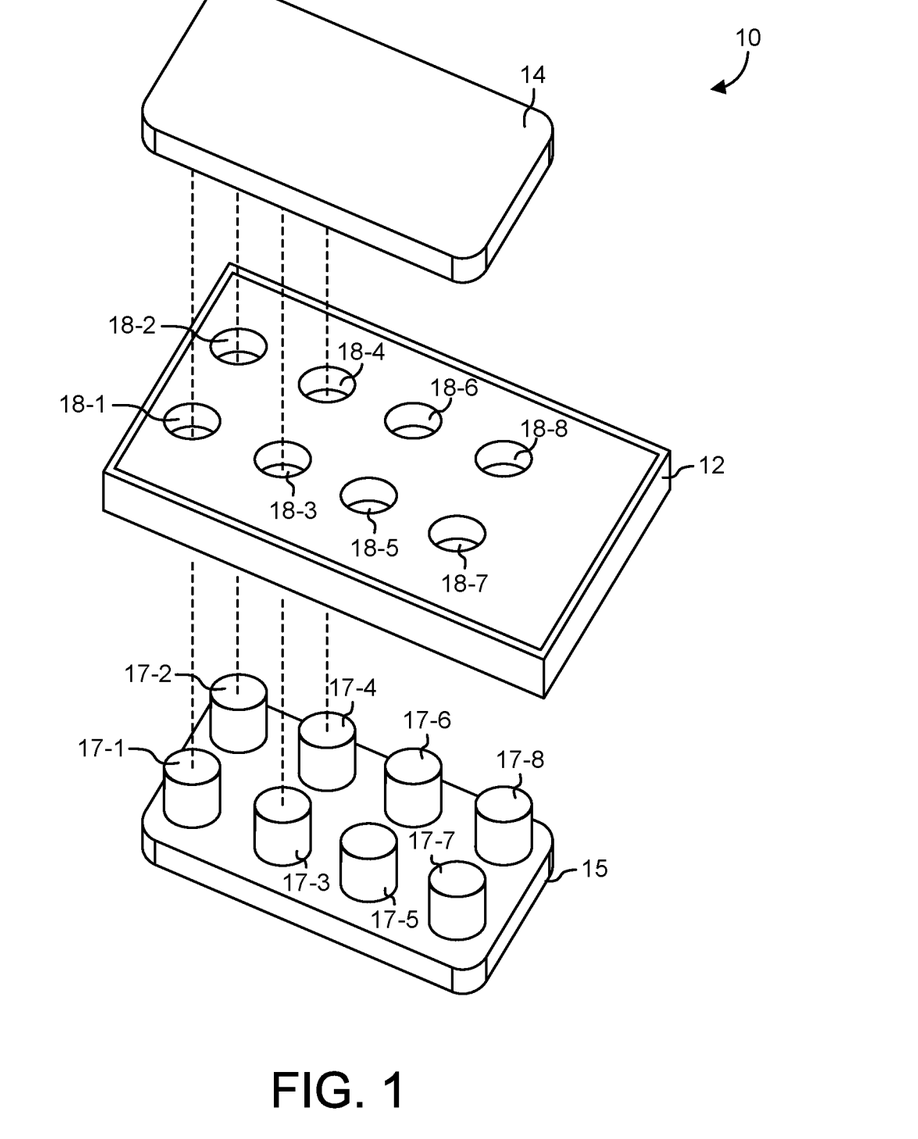
FIG. 1 shows an exploded perspective view of an electronics assembly comprising a planar transformer according to an exemplary embodiment.
Figure 2:
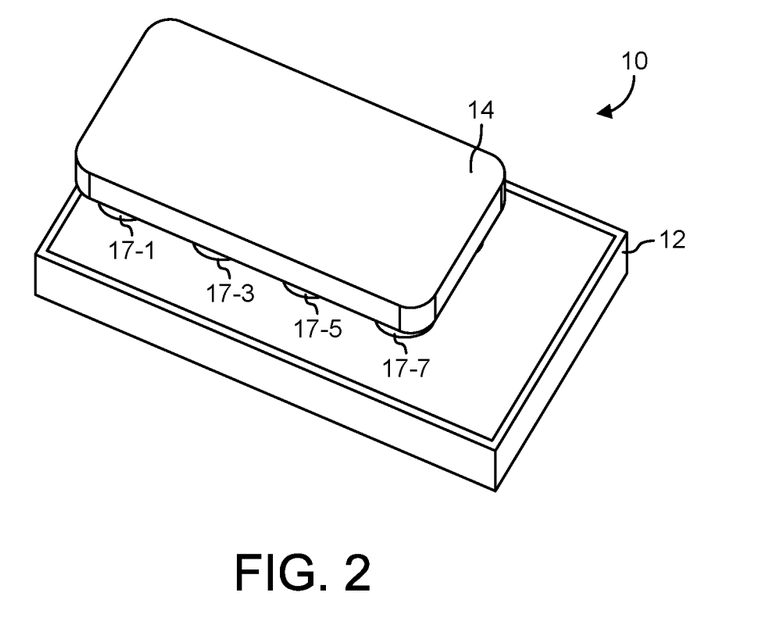
FIG. 2 shows a perspective view of the electronics assembly of FIG. 1 after assembly according to an exemplary embodiment.

An electronic assembly 10 including a planar transformer is illustrated in the exploded perspective view of FIG. 1 and the assembled view of FIG. 2 according to an exemplary embodiment. As shown, the assembly 10 typically includes a multilayer PCB 12 having apertures, e.g. holes 18-1 through 18-8, for receiving a respective core leg, a magnetically permeable core plate 14, and a magnetically permeable element 15 having a plurality of core legs, e.g. core legs 17-1 through 17-8. The multilayer PCB 12, which may include a plurality of conductive layers arranged in a stack with insulating material there between, may include windings formed in selected ones of the conductive layers. The core pieces 14 and 15, may be assembled onto the PCB 12 as shown in FIGS. 1 and 2 with the core legs 17-1 through 17-8 inserted through the respective apertures, 18-1 through 18-8. The legs may be in direct contact with, or to set a gap spaced apart by a predetermined distance from, the matching core piece thereby completing the magnetic circuits.

In some implementations, a multiplicity of secondary windings may be coupled to a multiplicity of core legs connected in a series-parallel arrangement. It can be shown that in such converters, e.g. those based upon the SAC technology, the output resistance decreases in inverse proportion to the number of core legs and further that using a multiplicity of core legs whose cross-section varies in inverse proportion to the output voltage of the SAC and its resonant frequency may be beneficial. Magnetic flux density in a core leg is inversely proportional to the leg cross-sectional area and core losses in ferrite cores operating at frequencies in the megahertz range increases at a rate approaching the cube of increases in flux density.

Figure 3:
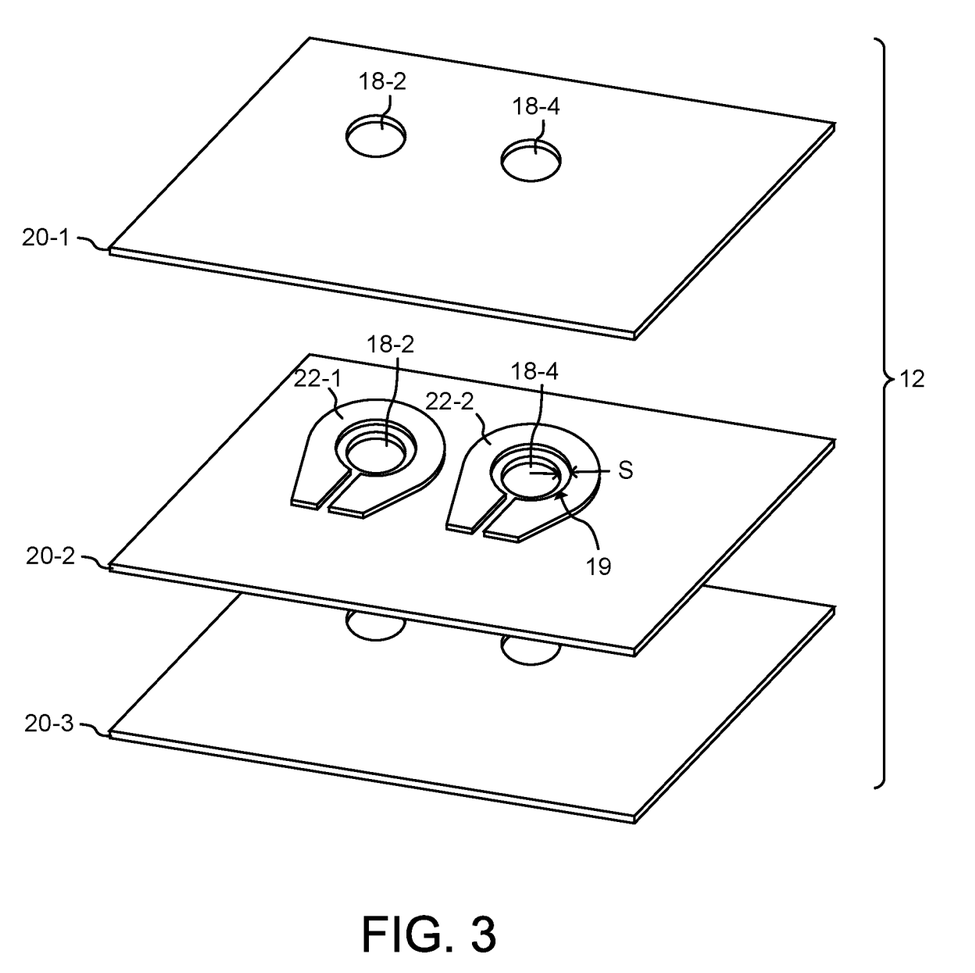
FIG. 3 shows an exploded perspective view of a portion of a multilayer PCB comprising etched windings according to an exemplary embodiment.

Referring to FIG. 3, an exploded perspective view of a portion of one multilayer PCB 12 configured for use in a planar transformer is shown according to an exemplary embodiment. As shown, the PCB 12 is constructed by assembling a plurality of individual PCB laminates, 20-1, 20-2, 20-3, each of which may typically include an insulation layer having one, or sandwiched between two, conductive metal layer(s) (not unlike simple single or double-sided PCBs). Two exemplary single-turn windings 22-1, 22-2 are formed on the top layer of laminate 20-2 as shown in FIG. 1. (As discussed above, each individual conductive layer may include one or more windings.) Each winding, 22-1, 22-2, surrounds a respective leg aperture, 18-2, 18-4, into which a magnetically permeable core leg (not shown) may be inserted. As shown in FIG. 3, the inner circumferential edge of each winding 22 is spaced apart, i.e. set back from, the edge of the respective aperture 18. The resulting setback region is an area free of conductive material shown in the figure as bands around the apertures 18 having a width dimension labeled "S" in FIG. 3. As discussed below, the setback region serves several purposes including providing a minimum distance for insulation between the core legs 16 and the windings 22 and to protect against creep corrosion.

Conventional PCB fabrication techniques used to manufacture multilayer PCBs such as PCB 12 shown in FIG. 3, depending on the process and equipment, may introduce variations in (a) the features formed in each conductive layer, e.g. conductive traces or turns; (b) the relative position of each conductive layer with respect to the other conductive layers in the multilayer PCB; the (c) size and (d) relative position of mechanical milling and drilling operations, e.g. to form the edges of the finished PCB and apertures in PCB, e.g. for the core legs. The PCB manufacturing tolerances drive PCB layout and design rules requiring, for example, minimum spacing between conductive features in the various layers and the edges or apertures of the finished PCB. Additionally, manufacturing tolerances associated with production of the magnetic core elements introduce variations in (e) the diameter and (f) relative position of the legs. By way of example, the location of each core leg relative to other core legs may exhibit a 6 mil tolerance ("mil" herein refers to a milli-inch; 1 mil=0.001 inch); the location of each leg aperture relative to other core leg apertures in the PCB may exhibit a 3 mils tolerance; and the location of each PCB winding pattern relative to the corresponding core leg aperture may exhibit a 3 mil tolerance, which together add up to a worst case cumulative tolerance of 12 mils.

The cumulative tolerances may therefore require larger apertures in the PCB to accommodate variations in size and spacing of the legs and greater setback of the windings from the apertures to accommodate PCB manufacturing, both of which reduce the area (diameter) available for the core legs. For example, a one-volt output SAC operating at 1.5 MHz may ideally require a core leg having a diameter of 60 mils. If an aperture slightly larger than 60 mils were used in each individual PCB, accommodating the cited tolerances would require that the core leg diameter be reduced by approximately 40% (e.g. to less than 40 mils). Alternatively, the aperture diameter may be increased to accommodate the desired core leg (60 mils diameter), requiring larger inner-diameter windings, which would come at the expense of narrower width conductive turns, i.e. increased winding resistance, or increased leg-to-leg spacing, i.e. greater core size. In either case the overall efficiency of the planar transformer will be reduced relative to the efficiency that might be achieved if the mechanical tolerances were not a factor.

The present disclosure provides exemplary techniques for fabricating circuits (e.g., multilayer PCBs) that address the limitations of conventional PCB fabrication processes noted above.

I. Self-Aligned Windings

Figure 4A:
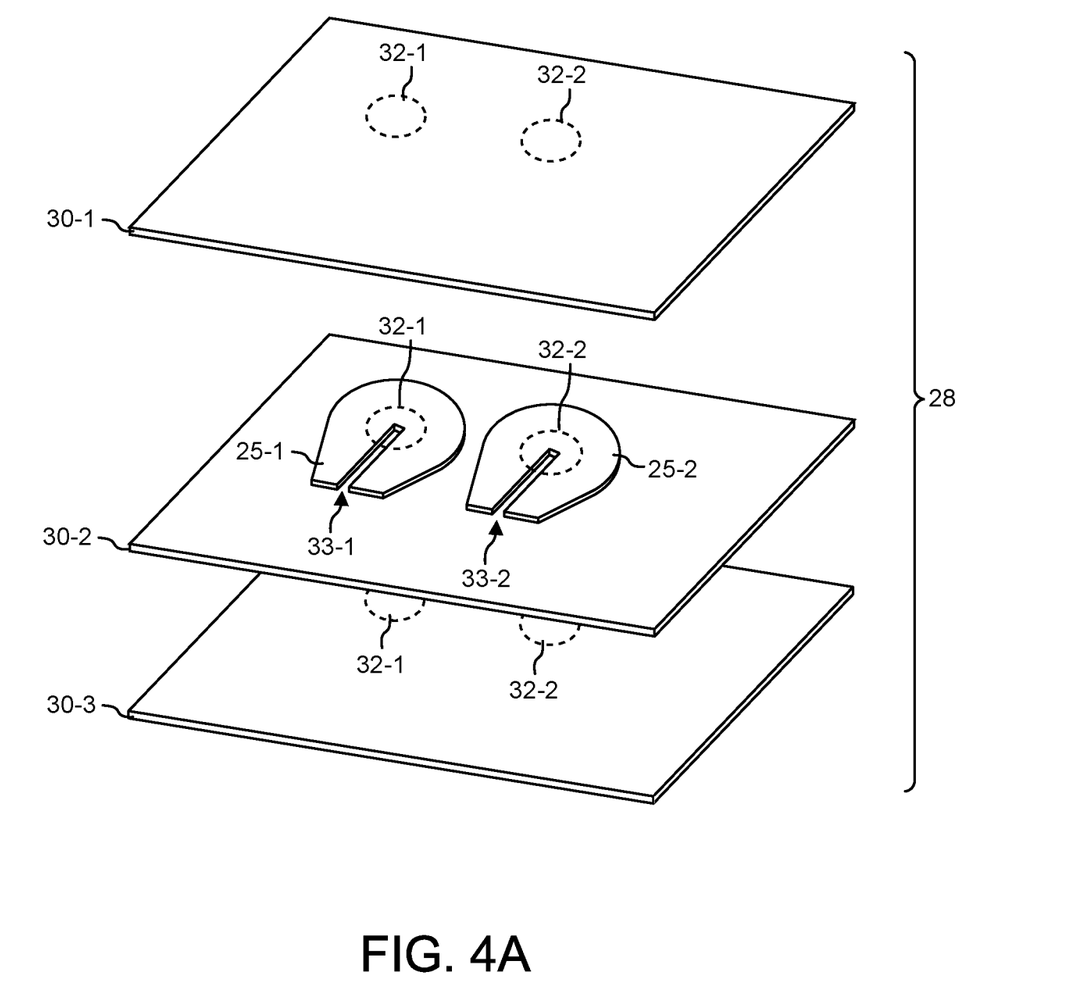
FIG. 4A shows an exploded perspective view of a portion of a multilayer PCB prior to the forming of apertures according to an exemplary embodiment.
Figure 4B:
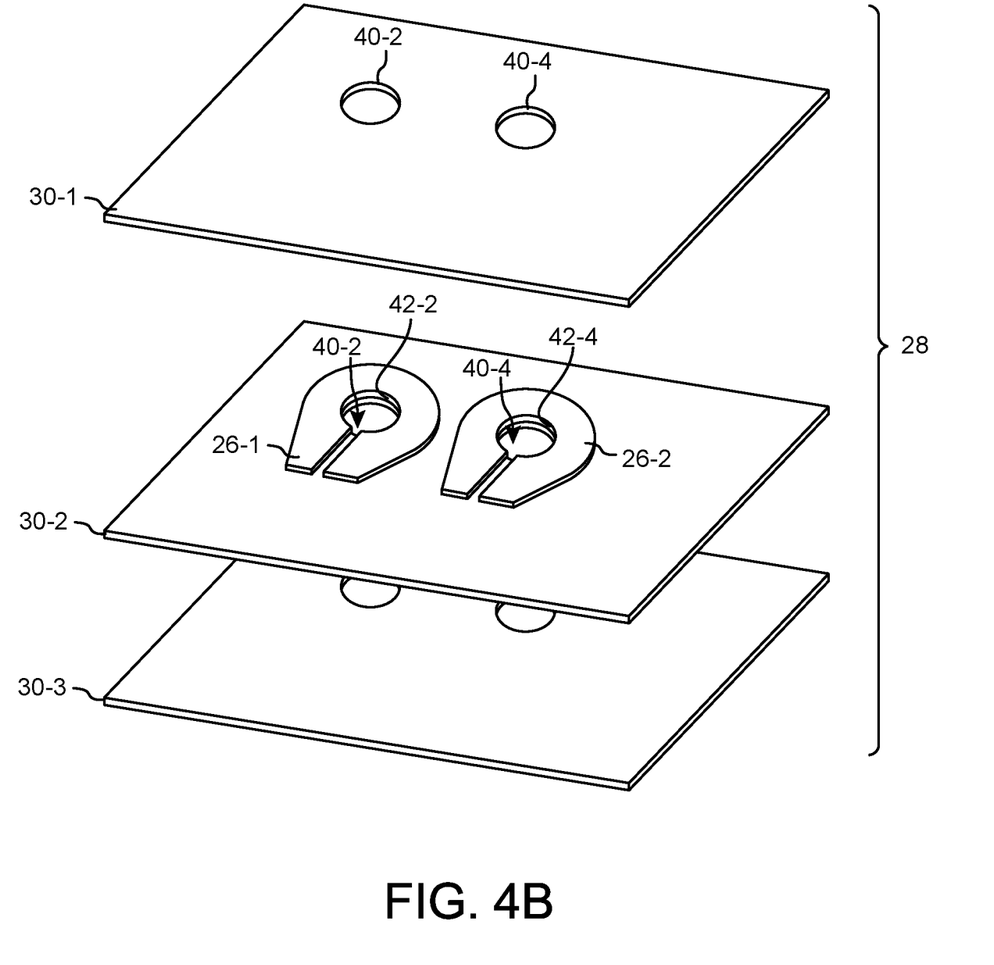
FIG. 4B shows an exploded perspective view of the multilayer PCB of FIG. 4A after the forming of apertures according to an exemplary embodiment.

A portion of a multilayer PCB 28 that is adapted for use in an improved planar transformer is shown in exploded perspective view at different stages of processing in FIGS. 4A and 4B, which respectively show the PCB before and after the leg apertures are formed. The multilayer PCB 28 as shown includes several individual laminates 30-1, 30-2, 30-3 and two exemplary winding features 26-1, 26-2 formed in the conductive layer of laminate 30-2. (It should be understood that each conductive layer may include one or more of such winding features.) The winding features 26-1 and 26-2 have been formed having the desired outer circumferential shape and dimensions for the finished winding and include the desired gap between the two ends of the winding, the gap being shown as a slot extending from the center to the ends of the respective winding features in FIG. 4A. Notably, the winding features 26-1, 26-2 may be formed as shown without any setback from the leg apertures (the regions encircled by broken lines 32-1, 32-2 in FIG. 4A), and in fact may extend into or completely cover those regions. After the PCB laminates, e.g. 30-1, 30-2, 30-3, are assembled together, the leg apertures may be formed, e.g. drilled or milled, in the locations 32-1, 32-2 shown forming the inner circumference of the windings (in all of the layers).

Figure 5:
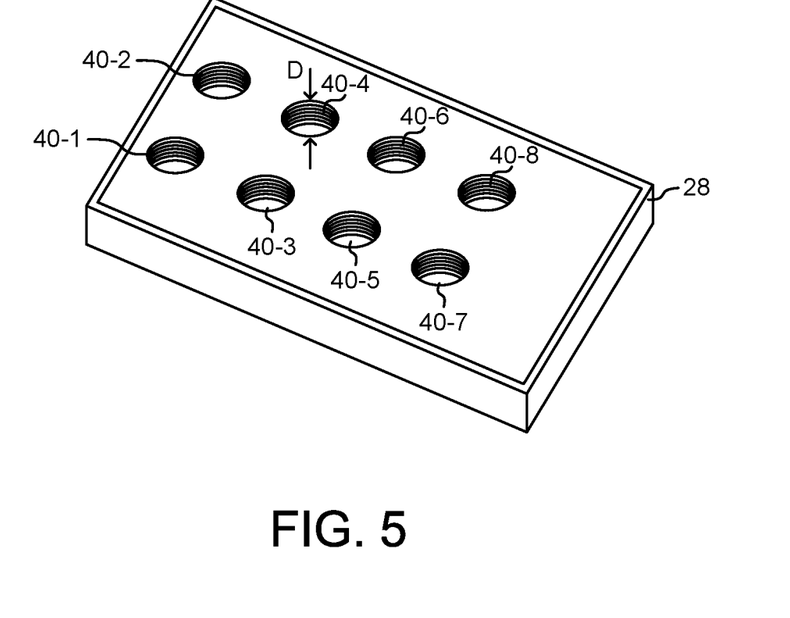
FIG. 5 shows a multilayer PCB with apertures according to an exemplary embodiment.

FIG. 4B shows the PCB layers after the leg apertures have been formed. Although the layers are shown exploded in FIGS. 4A and 4B, non-plated holes such as those used for core legs are generally formed as one of the last fabrication steps in the PCB manufacturing process, well after the plurality of laminate layers are bound together into the final multilayer stack. Eliminating the winding setback and using the leg aperture formation step to cut the inner circumference of the conductive windings produces windings having inner edges 42-2, 42-4 that are coaxial and coterminous with their respective apertures as shown in FIG. 4B. Windings formed in this manner may be called "self-aligned." Forming the apertures and the windings inner-circumference in the same manufacturing step, e.g. by drilling or milling, eliminates some of the variations arising from limitations in the PCB manufacturing process, e.g. variations in the conductive features formed in each layer and in the relative position (e.g. lateral position) of each layer with respect to other layers. Additionally, some or all of the volume previously occupied by the eliminated winding setback may be used to increase the leg diameter and thus reduce flux density and as a result, core losses. A finished PCB having self-aligned windings and holes (leg apertures 40-1 through 40-8) is shown in FIG. 5.

Figure 6:
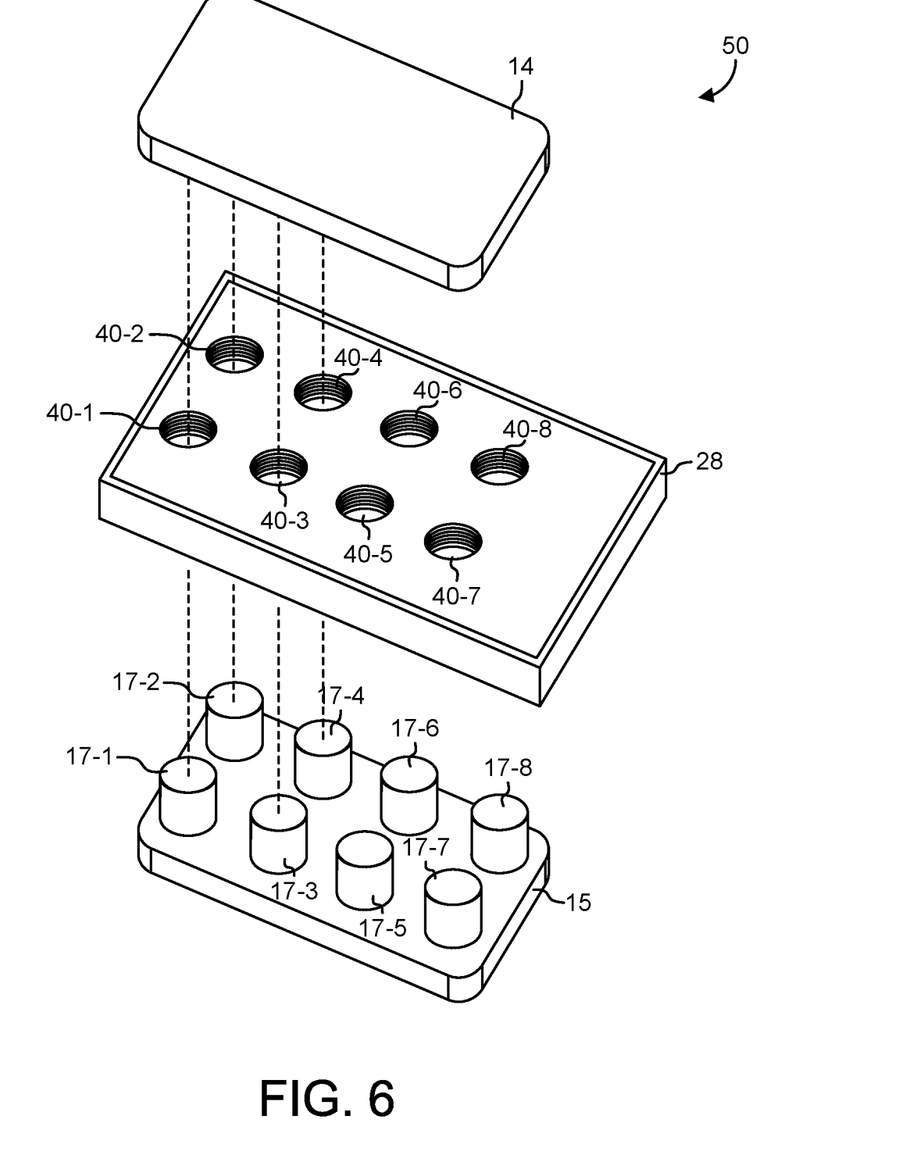
FIG. 6 shows an exploded perspective view of an electronics assembly comprising a planar transformer comprising a magnetic core element with integral legs according to an exemplary embodiment.

Referring to FIG. 6, an example of an apparatus 50 including a planar transformer consisting of a self-aligned PCB 28, i.e. having self-aligned windings (FIGS. 4A, 4B, 5), and a magnetic circuit comprising a magnetic core plate 14 and core element 15 of the kinds shown in FIGS. 1 and 2. As described earlier, core element 15 includes integral core legs 17 that pass through apertures 18. Assembly of the core element 15 and core plate 14 with the PCB 28 may be as described earlier. However, use of the self-aligned windings in the PCB 28 helps reduce the tolerances as noted above, allowing relatively larger core legs 17 or wider winding traces or both to be used to reduce transformer losses.

It should be noted that not all of the windings need be formed using the self-aligned process. In other words, some of the windings, e.g. higher voltage primary windings, may be formed traditionally with normal setback features and other windings in the transformer, e.g. low voltage secondary windings, may be formed using the self-aligned methods.

While the leg apertures and inner edges of the windings are shown in the Figures as being substantially cylindrical, it should be understood that, in various implementations, the leg apertures and/or inner edges of the windings may have any type of shape (e.g. ovular, rectangular, etc.). In some implementations, the shapes of the leg apertures and the inner edges of the windings may be complementary, such that the shapes are substantially similar and/or the winding setback is substantially the same around the edge/circumference of the leg aperture. In some implementations, the shapes may not be complementary, such that the shapes may be at least partially different and/or the winding setback is different adjacent to different areas of the leg aperture. All such implementations are contemplated within the scope of the present disclosure.

II. Self-Aligned Legs

Figure 7:
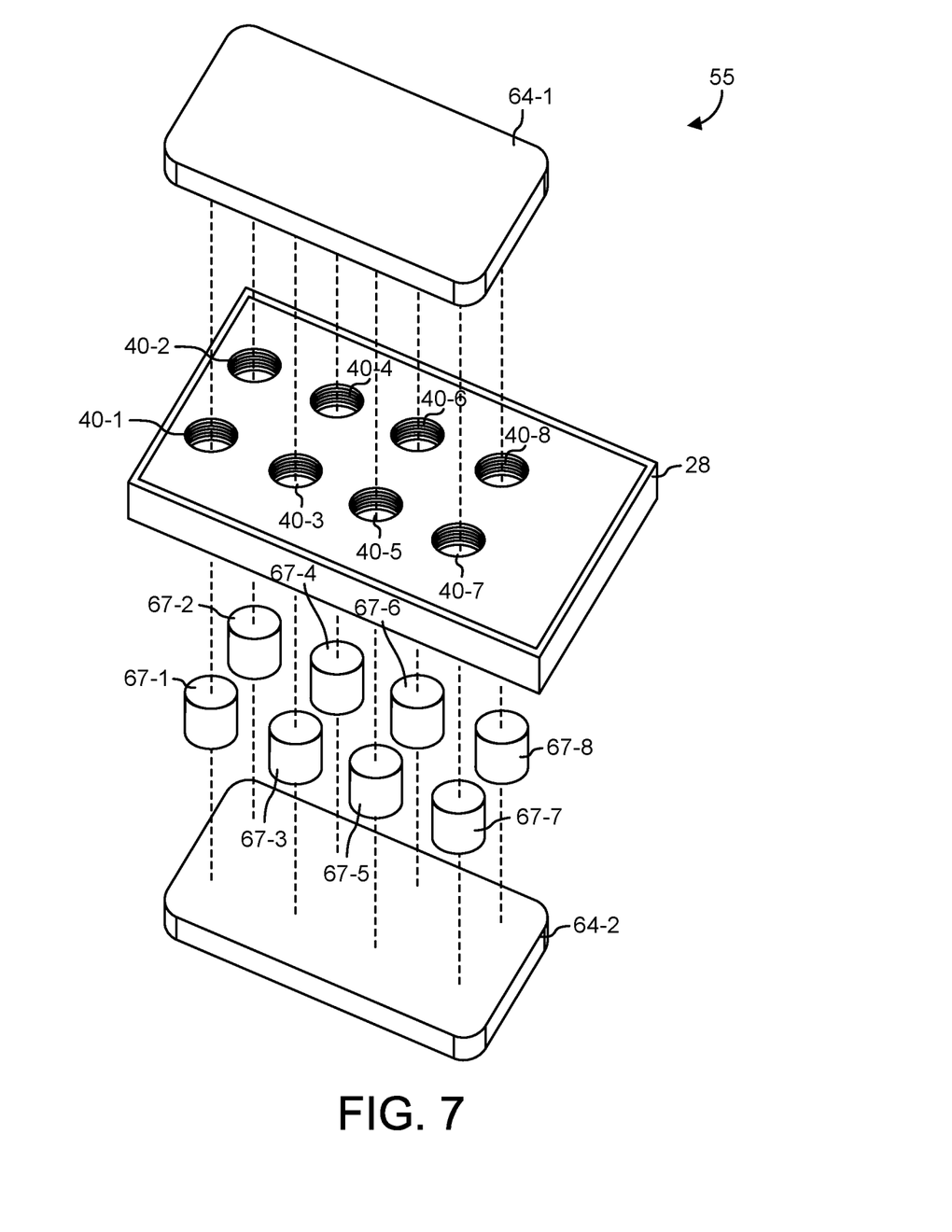
FIG. 7 shows an exploded perspective view of an electronics assembly comprising a planar transformer comprising a plurality of separate magnetic core legs according to an exemplary embodiment.

While the apparatus 50 in FIG. 6 benefits from the elimination of some manufacturing tolerances, other tolerances associated with variations in the relative locations of the core legs 17-1 through 17-8 with respect to each other must still be addressed in the PCB design. Referring to FIG. 7, an apparatus 55 includes an improved planar transformer which also uses a self-aligned PCB 28, but has a magnetic circuit formed by eight individual core legs, 67-1 through 67-8 between two magnetically permeable core plates 64-1, 64-2.

The apparatus 55 (FIG. 7) may be assembled by (a) fastening one of the core plates (e.g. core plate 64-2) to a first surface of multilayer PCB 28 with the core plate overlaying the apertures 40-1 through 40-8; (b) inserting core legs into apertures 40-1 through 40-8; (c) fastening a second core plate (e.g. core plate 64-1) to the other surface of multilayer PCB 28 with the core plate overlaying the ends of the core legs 67-1 through 67-8. One or the other of the core plates may be placed in contact with the legs or may be spaced away from the legs to form a gap in the magnetic circuit. Fastening may be by means of an epoxy adhesive or other adhesive or fastening technique.

Because each core leg 67-1 through 67-8 is independent of other core components, its placement into a respective leg aperture 40-1 through 40-8 in the PCB before being assembled to the core plates, eliminates the need to account for variations in relative leg position, allows for smaller leg apertures to be used, and results in better spacing and alignment between the windings and the core legs. The core structure may thus be said to have self-aligned legs. The apparatus 55 with self-aligned legs therefore improves upon the apparatus 50 (FIG. 6) eliminating the tolerances required by variations in the relative positions of integral core legs, e.g. legs 17-1 through 17-8 (FIG. 6), and allowing further reductions in planar transformer losses. Relative to a prior art SAC converter, the structure 55 of FIG. 7 may allow reduction in core losses (e.g. of 20% or 30%) and a reduction in converter output resistance (e.g. of 5% or 10%).

It should be noted that while the combination of the self-aligned cores with self-aligned windings may be preferable in some embodiments, the self-aligned core legs may be used independently of the self-aligned windings in other embodiments.

III. Self-Aligned Insulation

After forming the apertures (e.g. 40-1 through 40-8) in a self-aligned PCB, the inner edges of the windings may be coterminous with the inner edge of the aperture (e.g. such that the inner edges of the windings substantially overlap the inner edge of the aperture and/or are positioned in substantially a same position in a lateral direction). The self-aligned windings being thus exposed in the leg apertures may be acceptable for some low voltage applications using core material having a sufficiently high resistivity. Alternatively, a modified PCB manufacturing process may be used to create a small setback or clearance between the winding and the aperture without adversely affecting the self-aligned position of the windings and apertures. The leg apertures may be formed after PCB laminates are assembled together in the PCB stack but before the outer conductive layers are etched. Doing so may allow the etchant bath access to the exposed inner circumference of the windings through the unmasked leg apertures. In the time it takes the etchant to remove unmasked material from the outer conductive layers having a 1 to 2 mils thickness, a 1 to 2 mils setback may be formed between the inner winding circumference and the leg apertures thus providing self-aligned setback between windings and the legs, in some embodiments.

The final stages of the manufacturing process for a multilayer PCB may include electrodeposition of copper onto unmasked regions of a copper foil or seed layer on outer surfaces of the laminated PCB assembly, followed by etching away of the undesired, previously masked, portion of the copper layer. If the leg apertures are formed after the electrodeposition step, the subsequent etching step may create the self-aligned setback (e.g. remove copper from the exposed inner circumferential edges of the self-aligned windings, e.g. edges 42, FIG. 4B). Among the benefits of this approach is the uniformity of the setback dimension around the inner edge of the leg aperture.

Etching as a means of providing the self-aligned setback is a predictable and repeatable process that may produce uniform spacing between a self-aligned winding and the inner edge of the leg aperture. According to some embodiments, a PCB process may form the outer conductive layers using the following steps: (1) laminate copper foil (e.g. ½ oz. (0.65 mils thick)) onto the PCB stack; (2) drill blind via holes; (3) electrodeposition of copper (e.g. 0.5 to 0.6 mils) to fill the blind via holes and build up the outer copper layers to a particular thickness (e.g. approximately 1.2 mils); (4) apply and pattern photoresist film to cover the portions of the copper that will be subsequently removed and leave exposed portions that will remain; (5) electroplate copper, e.g. to a total thickness of 2 mils, and then tin as an etch resistant; and (6) etch away the exposed copper. In some embodiments, the outer conductive layers before the final etch step (6) in such a process may have approximately 2.0 mils thick copper (covered with tin) for the pattern that remains, and 1.2 mils thick copper (without tin covering) of the pattern may be removed by the final etch step. In such a process, the leg apertures may preferably be formed, e.g. by drilling, before the final etch step 6 (which removes the exposed unprotected copper layer) and either after deposition of the patterned copper and etch-resistant tin in step 5 for PCBs including self-aligned windings on the outer conductive layers or after electrodeposition in step 3 for PCBs not having self-aligned windings in the outer conductive layers. The final etch step may leave the tin-plated copper pattern remaining on the outer layers and create a nominal 2.0 mil (1.0 mil minimum) setback from the leg apertures to the edges of the self-aligned windings on the inner and if present outer conductive layers. The 1.0 mil setback may be sufficient insulation for low voltage (e.g. 1 V) applications.

Windings situated on the outer conductive layers of the PCB may be formed using the above described self-aligned winding process (using the leg aperture formation step to cut the inner circumference of the conductive windings) and the above-described self-aligned setback process (using the final etch of the outer layers to form set back from the leg apertures) or alternatively using standard lithographic techniques which will impose some setback dimensions specific to the process used. In the latter alternative, the leg apertures may be formed before and covered by the film applied in step 4 (preventing plating in the leg apertures during the electroplating in step 5). The film will be stripped before the final etch in step 6 allowing the formation of the self-aligned setback for winding features in the inner conductive layers.

In addition, or as an alternative, to the self-aligned set back process, insulation between the windings and the core legs may be provided for example by applying a uniform coating of electrically insulating material, e.g. parylene or epoxy, to the core legs or the inner surface of the leg apertures, or both.

IV. Assembly

Figure 8:
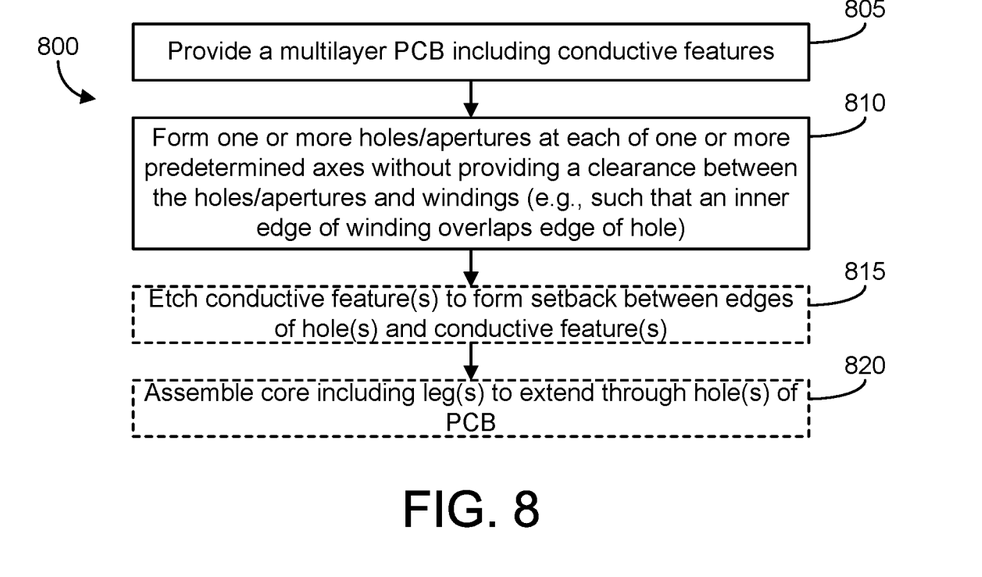
FIG. 8 shows a flow diagram of a process for forming a circuit (e.g., planar magnetic component) according to an exemplary embodiment.

Referring now to FIG. 8, a method 800 that may be used to form a circuit (e.g. planar magnetic component) is shown according to an exemplary embodiment. A multilayer PCB may be provided that includes conductive features (805). The conductive features may be arranged on conductive layers of the PCB to form windings around one or more axes (e.g. axes perpendicular to the layers of the PCB). One or more holes may be formed in the PCB at the axes (810). After the holes are formed, there may be no clearance provided between an inner edge of the conductive features (e.g. windings) and an edge of the holes. For example, the edges may be coterminous, such that, for example, an inner edge of the windings overlaps an edge of the hole in a lateral direction.

In some implementations, method 800 may include etching one or more of the conductive features/windings to form a clearance or setback between the edges of the hole(s) and inner edges of the conductive feature(s) (815). For example, in some embodiments, the inner edge of the conductive feature(s) may be etched radially outward from within the hole(s) to form the setback by removing a setback portion of the conductive feature(s).

In some implementations, method 800 may include assembling a core including one or more core legs (820). The core legs may be structures to extend through the hole(s) of the PCB (e.g. perpendicular to layers of the PCB). In some implementations, the core legs may be structured to mate or couple with a second core portion, such as a core plate, on an opposite side of the PCB.

In some particular implementations, one or more of the following steps may be used, alone or in combination, for making an improved planar transformer using magnetic cores with integral legs and plates:

a) Build the multilayer PCB having winding features extending into the intend leg aperture regions, i.e. without setback;
  b) Form the leg apertures, e.g. by drilling or milling;
  c) Optionally etch the inner circumference of the exposed windings after the apertures are formed;
  d) Assembling a first core piece from one side of the PCB with any legs of the first core piece extending into the leg apertures, optionally affixing the core piece to the PCB, e.g. with an adhesive, such as epoxy, optionally applied to the PCB or the core piece, or both, preferably applied before mating the two pieces, and optionally curing the adhesive after mating;
  e) Optionally dispense adhesive to some or all of the following: the other side of the PCB, into apertures, or the second core piece, optionally setting desired gaps between the core pieces, e.g. optionally using gap glue in the apertures;

f) Assemble the second core piece from the other side of the PCB, with any legs of the second core piece extending into the respective leg apertures, and optionally cure the adhesive and/or gap glue.

In some particular implementations, one or more of the following steps may be used, alone or in combination, for making a planar transformer using plates and a plurality of separate core legs:

a) Build the multilayer PCB having winding features extending into the intend leg aperture regions, i.e. without setback;

b) Form the leg apertures, e.g. by drilling or milling;

c) Optionally etch the inner circumference of the exposed windings after the apertures are formed;

d) Assemble a first core piece from one side of the PCB with any legs of the first core piece extending into the leg apertures, optionally affixing the core piece to the PCB, e.g. with an adhesive, such as epoxy, optionally applied to the PCB or the core piece, or both, preferably applied before mating the two pieces, and optionally curing the adhesive after mating;

e) Optionally dispense gap glue in the apertures;

f) Place core legs into apertures, optionally dispensing gapping material in the apertures before placing the legs, after placing the legs, or both;

g) Deposit core attach adhesive (e.g. epoxy) to the other outer surface of the multilayer PCB for use in attaching a second magnetically permeable plate;

h) Assemble the second core piece from the other side of the PCB over the core legs, optionally affixing the core piece to the PCB, e.g. with an adhesive, such as epoxy, optionally applied to the PCB or the core piece, or both, preferably applied before mating the two pieces, and optionally curing the adhesive after mating.

A number of embodiments of the invention have been described. Nevertheless, it will be understood that various modifications may be made without departing from the spirit and scope of the invention. For example, the following features each may be used independently or in any combination: self-aligned windings, self-aligned core structures, self-aligned spacing, and self-aligned insulation. A wide variety of magnetic core configurations may be used, including, but not limited to: one or more U-cores combined with plates; pairs of symmetrical cores with legs inserted from both sides of a multilayer PCB; and a plurality of core pieces with multiple legs. The aperture may be of any shape required to accommodate a chosen set of magnetic elements.

The disclosure is described above with reference to drawings. These drawings illustrate certain details of specific embodiments that implement the systems, apparatus, and/or methods of the present disclosure. However, describing the disclosure with drawings should not be construed as imposing on the disclosure any limitations that may be present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that although the disclosure provided herein may describe a specific order of method steps, it is understood that the order of these steps may differ from what is described. Also, two or more steps may be performed concurrently or with partial concurrence. It is understood that all such variations are within the scope of the disclosure.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and its practical application to enable one skilled in the art to utilize the disclosure in various embodiments and with various modifications as are suited to the particular use contemplated.

What is claimed is:

1. A method, comprising:
providing a multilayer printed circuit board (PCB) comprising one or more conductive features each arranged on one or more conductive layers of the multilayer PCB such that each of the one or more conductive features forms a winding around a predetermined axis;
forming a hole in the multilayer PCB at the axis of the winding formed from each of the one or more conductive features to accommodate a core leg, wherein for each hole, an inner circumferential edge of a respective one of the one or more conductive features overlap an edge of the hole in a lateral direction after the hole is formed; and
for each hole, etching the multilayer PCB after forming the hole to create a setback between the inner circumferential edge of the respective one of the one or more conductive features and the hole, the setback being created by etching from within the hole radially outward along the inner circumferential edge to remove a setback portion of the respective one of the one or more conductive features.

2. The method of claim 1, wherein:
at least one of the one or more conductive features is located on an inner layer of the multilayer PCB between a top layer and a bottom layer of the multilayer PCB.

3. The method of claim 1, wherein:
at least one of the one or more conductive features is located on a top layer or bottom layer of the multilayer PCB;
the method further comprising:
covering an exterior surface of the at least one of the one or more conductive features to restrict the etching to acting on the at least one of the one or more conductive features from within the respective hole radially outward along the inner circumferential edge.

4. The method of claim 1, wherein:
the one or more conductive features include:
at least one inner conductive feature arranged on an inner conductive layer of the multilayer PCB; and
at least one outer conductive feature arranged on an outer conductive layer of the multilayer PCB;
the method further comprising:
covering an exterior surface of the at least one outer conductive feature to restrict the etching to acting on the at least one outer conductive feature from within the respective hole radially outward along the inner circumferential edge.

5. The method of claim 1, further comprising:
providing the core legs;
coating the core legs with an electrically insulating material; and
inserting each core leg into one of the respective holes.

6. The method of claim 1, wherein:
for each hole, the one or more conductive features include:
- at least one respective inner conductive feature arranged on an inner conductive layer of the multi-layer PCB; and
- at least one respective outer conductive feature arranged on an outer conductive layer of the multi-layer PCB;

the method further comprising:
forming a second setback between the at least one respective outer conductive feature and the respective hole by leaving a portion of an exterior surface of the at least one respective outer conductive feature uncovered during the etching.

7. The method of claim 1, further comprising:
assembling a magnetically permeable core comprising the one or more core legs, each of the one or more core legs extending into a respective hole at each of the one or more predetermined axes.

8. The method of claim 1, further comprising:
forming each hole through the multilayer PCB to remove portions of the one or more conductive features from a center of each hole to the inner circumferential edge of each of the one or more conductive features.

9. The method of claim 1, further comprising:
forming the setback by leaving a portion of an exterior surface of each of the one or more conductive features uncovered during the etching.

10. The method of claim 1, further comprising:
covering an exterior surface of each of the one or more conductive features to restrict the etching to a portion of the exterior surface from within the hole radially outward along the inner circumferential edge.

11. The method of claim 1, further comprising:
identifying areas on the multi-layer PCB to form the holes through layers of the multi-layer PCB;
forming the one or more conductive turns on the layers of the multi-layer PCB at respective areas, each of the one or more conductive turns including (i) an outer circumference around a respective area and (ii) a conductive portion extending from the outer circumference into the respective area; and
forming a respective hole at each of the identified areas after forming the one or more conductive turns.

12. The method of claim 11, further comprising:
stacking the layers of the multi-layer PCB to align the one or more conductive turns with each other, each of the layers of the multi-layer PCB separated from each other by at least one intervening insulation layer.

* * * * *